United States Patent [19]
Suzuki

[11] Patent Number: 5,920,795
[45] Date of Patent: Jul. 6, 1999

[54] METHOD FOR MANUFACTURING SEMICONDUCTOR DEVICE

[75] Inventor: Tatsuya Suzuki, Tokyo, Japan

[73] Assignee: NEC Corporation, Tokyo, Japan

[21] Appl. No.: 08/851,366

[22] Filed: May 5, 1997

[30] Foreign Application Priority Data

May 15, 1996 [JP] Japan ................................ 8-120131

[51] Int. Cl.$^6$ ................................................. H01L 21/44
[52] U.S. Cl. ......................... 438/680; 438/607; 438/640
[58] Field of Search .................................. 438/311, 314, 438/341, 481, 680, 309, 640, 607

[56] References Cited

U.S. PATENT DOCUMENTS

| | | | |
|---|---|---|---|
| 4,717,681 | 1/1988 | Curran | 437/31 |
| 5,516,710 | 5/1996 | Boyd et al. | 438/640 |

FOREIGN PATENT DOCUMENTS

| | | |
|---|---|---|
| 62139335 | 6/1985 | Japan . |
| 61-270829 | 12/1986 | Japan . |
| 63-048817 | 3/1988 | Japan . |
| 63-051641 | 3/1988 | Japan . |
| 1010616 | 1/1989 | Japan . |
| 1023538 | 1/1989 | Japan . |
| 4304635 | 10/1992 | Japan . |

OTHER PUBLICATIONS

"Investigations on Hydrophilic and Hydrophobic Silicon (100) Wafer Surfaces by X–Ray Photoelectron and High––Resolution Electron Energy Loss–Spectroscopy" Grundner et al; Appl. Phys. A 39; pp. 73–82; 1986.

Primary Examiner—Charles Bowers
Assistant Examiner—Reneé R. Berry
Attorney, Agent, or Firm—Hayes Soloway Hennessey Grossman & Hage PC

[57] ABSTRACT

A method for manufacturing a semiconductor device is disclosed herein by which the contamination of an epitaxial film-Si substrate interface with carbon can be solved without allowing boron to remain in the epitaxial film-Si substrate interface. The method for manufacturing a semiconductor device according to the present invention comprises a step of ion-implanting, into an Si substrate, an element or a compound which easily reacts with carbon, a step of removing a natural oxide film on the Si substrate, a step of annealing, at a temperature of 800° C. or less in a CVD device, the Si substrate which has been subjected to the ion-implantation and the removal of the natural oxide film by the above two steps, and a step of carrying out an Si epitaxial growth or an $Si_{1-x}Ge_x$ epitaxial growth on the annealed substrate by the CVD device.

7 Claims, 7 Drawing Sheets

METHOD FOR MANUFACTURING SEMICONDUCTOR DEVICE

BACKGROUND OF THE INVENTION (i) Field of the Invention

The present invention relates to a method for reducing the amount of a carbon contamination particularly in an interface between an epitaxial film and an Si substrate in an Si epitaxial growth or an $Si_{1-x}Ge_x$ epitaxial growth onto the Si substrate by using a gas such as $SiH_4$, $Si_2H_6$, $GeH_4$ or $B_2H_6$ as a material and using a CVD device.

(ii) Description of the Prior Art

With regard to the technique of an Si epitaxial growth or an $Si_{1-x}Ge_x$ epitaxial growth onto an Si substrate by using a gas such as $SiH_4$, $Si_2H_6$, $GeH_4$ or $B_2H_6$ as a material and using an ultra high vacuum type CVD device (hereinafter referred to as "the UHV-CVD device") in which vacuum exhaust is possible up to an ultravacuum region, its application to a channel epistructure in a fine CMOS at a level of 0.1 μm and a next generation bipolar transistor is particularly expected. Heretofore, this kind of epitaxial growth has been carried out as follows.

In the first place, a natural oxide film on the surface of an Si substrate is removed by a dilute hydrofluoric acid (DHF) treatment, and an agent solution was then washed out with water, immediately followed by washing with an ammonia-hydrogen peroxide-pure water mixed agent solution (APM washing), to remove particles and organic substances on the surface of the substrate. Afterward, the agent solution is washed out with water. In order to remove the natural oxide film formed by the APM washing, the dilute hydrofluoric acid (DHF) treatment is further carried out. Afterward, water washing is done, and the Si substrate is then dried, for example, by the use of a spin drier. Next, the Si substrate is loaded into a growth chamber 9 of a UHV-CVD device shown in FIG. 6. The loaded Si substrate 8 is supported by a susceptor 12, and then heated by a substrate heater 11. A heater chamber 10 in which the substrate heater 11 is installed, and the growth chamber 9 are differentially exhausted by the Si substrate 8 itself, and the respective chambers are exhausted to a vacuum level of $10^{-9}$ to $10^{-10}$ Torr by a turbo-molecular pump 13. Here, a final wet pretreatment of the Si substrate is the DHF treatment, and therefore the surface of the Si substrate remains exposed. In consequence, organic substances in a clean room atmosphere are deposited on the Si substrate during an interval until it is loaded into the UHV-CVD device [Applied Physics A39, p. 73 (1986)]. If the epitaxial growth is carried out, allowing the organic substances (carbon) to remain, a carbon contamination remains in an epitaxial film-Si substrate interface, so that the crystallinity of the epitaxial film noticeably deteriorates and, for example, the deterioration of electric properties such as the backward bias leak current of a pn junction occurs. Thus, after the Si substrate 8 is loaded into the growth chamber 9, it is once heated up to high temperature such as 850° C. by the substrate heater 11 and then subjected to hydrogen annealing at this temperature at a vacuum degree of 10 Torr. By this treatment, the above carbon contamination can be removed (The 42nd Applied Physics Related Combination Lecture (1995) Preliminary Manuscript, 29a-Q-8). Afterward, the temperature is lowered to 800° C. or less, and an Si epitaxial growth or an $Si_{1-x}Ge_x$ epitaxial growth is then carried out onto the Si substrate 8 by the use of a gas such as $SiH_4$, $Si_2H_6$, $GeH_4$ or $B_2H_6$ as a material at a temperature of 600 to 800° C. For example, in the case that a selected $Si_{1-x}Ge_x$ epitaxial film is applied onto a base of a high-speed bipolar transistor, an $Si_2H_6$ gas or a $GeH_4$ gas is first used to grow a non-doped selected $Si_{1-x}Ge_x$ epitaxial film, and an $Si_2H_6$ gas, a $GeH_4$ gas or a $B_2H_6$ gas is then used to grow an in-situ B-doped selected $Si_{1-x}Ge_x$ epitaxial film (so that aparasitic barrier by an $Si_{1-x}Ge_x$—Si hetero junction may not be formed at a base-collector junction).

When the Si epitaxial growth or the $Si_{1-x}Ge_x$ epitaxial growth is carried out in the above conventional manner, a contamination, particularly boron (B) in the growth chamber 9 is deposited on the Si substrate during the hydrogen annealing which is carried out immediately before the epitaxial growth. This takes place for the following reason. In the UHV-CVD device, the $B_2H_6$ gas or the like is used for the sake of the in-site boron doping into the epitaxial film, but when this gas is introduced into the growth chamber, boron adheres to the inside wall of the growth chamber and it remains thereon. Furthermore, also in the case that the Si substrate already doped with boron at a high concentration is treated, boron vaporizes from the surface of the Si substrate, and it adheres to the inside wall of the growth chamber and remains thereon. Then, when the temperature of the growth chamber becomes higher temperature than 800° C., the remaining boron tends to volatilize from the inside wall of the growth chamber, and it is also deposited on the Si substrate.

If the temperature is lowered, allowing boron to adhere onto the Si substrate and this substrate is then subjected to the epitaxial growth as it is, boron remains in the epitaxial film-Si substrate interface. This has a bad influence on electric properties of devices such as the fluctuation of a threshold voltage in a fine CMOS (because in an n-channel transistor, the threshold voltage is controlled by a boron concentration in a channel section) and the deterioration of a cut-off frequency in a high-speed bipolar transistor using the $Si_{1-x}Ge_x$ epitaxial film as a base (because a parasitic barrier by boron is formed at a base-collector junction).

SUMMARY OF THE INVENTION

The present invention has been developed with the intention of solving these problems, and an object of the present invention is to solve the problem of a carbon contamination in an epitaxial film-Si substrate interface, without allowing boron to remain in the epitaxial film-Si substrate interface.

That is to say, the present invention is directed to a method for manufacturing a semiconductor device which comprises a step of ion-implanting, into an Si substrate, an element or a compound which easily reacts with carbon, a step of removing a natural oxide film on the Si substrate, a step of annealing, at a temperature of 800° C. or less in a CVD device, the Si substrate which has been subjected to the ion-implantation and the removal of the natural oxide film by the above two steps, and a step of carrying out an Si epitaxial growth or an $Si_{1-x}Ge_x$ epitaxial growth on the annealed substrate by the CVD device.

According to the present invention, the problem of the carbon contamination can be solved in the manner that the ion-implanted element or compound reacts during the annealing with the carbon (organic substances) adhered to the surface of the substrate after the removal step of the natural oxide film to vaporize and remove the carbon. In addition, this annealing temperature can be set to 800° C. or less which is lower than a conventional annealing temperature, and therefore it can be prevented that boron and the like which remain on the inside wall of the CVD device are volatilized therefrom and then deposited on the substrate. That is to say, according to the present invention, boron can be prevented from remaining in the epitaxial film-Si substrate interface, whereby the problem of the carbon contamination in the epitaxial film-Si substrate interface can be solved.

BRIEF DESCRIPTION OF THE DRAWINGS

In FIG. 5, 1 is an emitter $N^+$ type polysilicon, 2 is a silicon oxide film, 3 is a $P^+$ type polysilicon, 4 is a base $Si_{1-x}Ge_x$ layer, 5 is a collector $N^-$ type epilayer, 6 is an $N^+$ layer, and 7 is a $P^-$ type Si substrate.

In FIG. 6, 8 is an Si substrate, 9 is a growth chamber, 10 is a heater chamber, 11 is a substrate heater, 12 is a susceptor, 13 is a turbo-molecular pump, and 14 is an inlet for a gas such as $SiH_4$, $Si_2H_6$, $GeH_4$ or $B_2H_6$.

DETAILED DESCRIPTION OF THE INVENTION

An element or a compound which easily reacts with carbon is what easily reacts with carbon at a temperature at the time of annealing. Examples of the element include oxygen, hydrogen and halogens. Examples of the halogens include chlorine, fluorine, bromine and iodine.

Examples of the compound include compounds of these elements mentioned above, and examples of such compounds include HF, $H_2O$ and HCl.

Above all, oxygen, hydrogen, chlorine and fluorine are preferable, and oxygen, hydrogen and chlorine are most preferable.

The element or the compound is preferably implanted into a position of the substrate which is not so deep from the surface of the substrate so that it may easily diffuse to the surface at the time of the annealing. This position is within 600 Å, preferably within about 250 Å from the surface of the substrate.

In the present invention, the substrate is usually washed to remove particles and organic substances on the surface of the substrate after the ion-implantation step. This washing is usually accomplished with an ammonia-hydrogen peroxide-pure water mixed agent solution (APM washing). In general, since Si is exposed on the surface of the substrate before the washing, a natural oxide film is formed on the surface of the substrate by this washing step.

No particular restriction is put on a removal method of the natural oxide film on the Si substrate, any method can be used, so long as it does not have a bad influence on the substrate. For example, a method using dilute hydrofluoric acid can be used. In addition, a method which is accomplished simultaneously with a next annealing step can also be employed.

A temperature for the annealing step is in a temperature range in which boron does not volatilize or scarcely volatilizes from the inside wall of a growth chamber of CVD and the ion-implanted element or compound is reacted with carbon (organic substances) on the surface of the substrate. Concretely, the temperature for the annealing step is in the range of 400 to 800° C., preferably 600° C. or more.

A gas which can be used as a material for an epitaxial growth in the present invention is preferably one or more selected from the group consisting of hydrides of Si, Ge and B such as $SiH_4$, $Si_2H_6$, $GeH_4$ and $B_2H_6$.

Next, the present invention will be described with reference to drawings.

EXAMPLE 1

Figure 1:
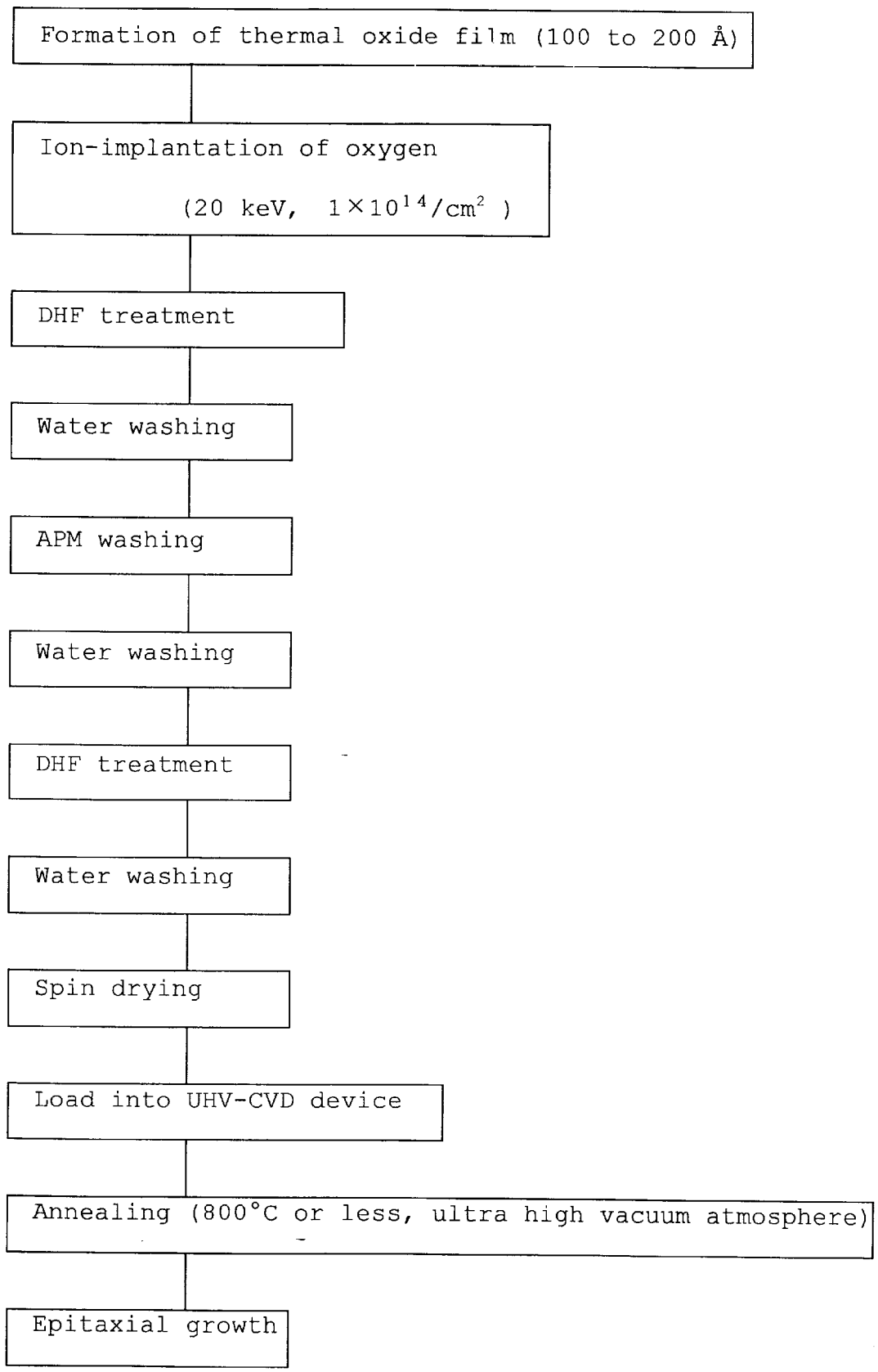
FIG. 1 is a flow sheet of Example 1.
Figure 6:
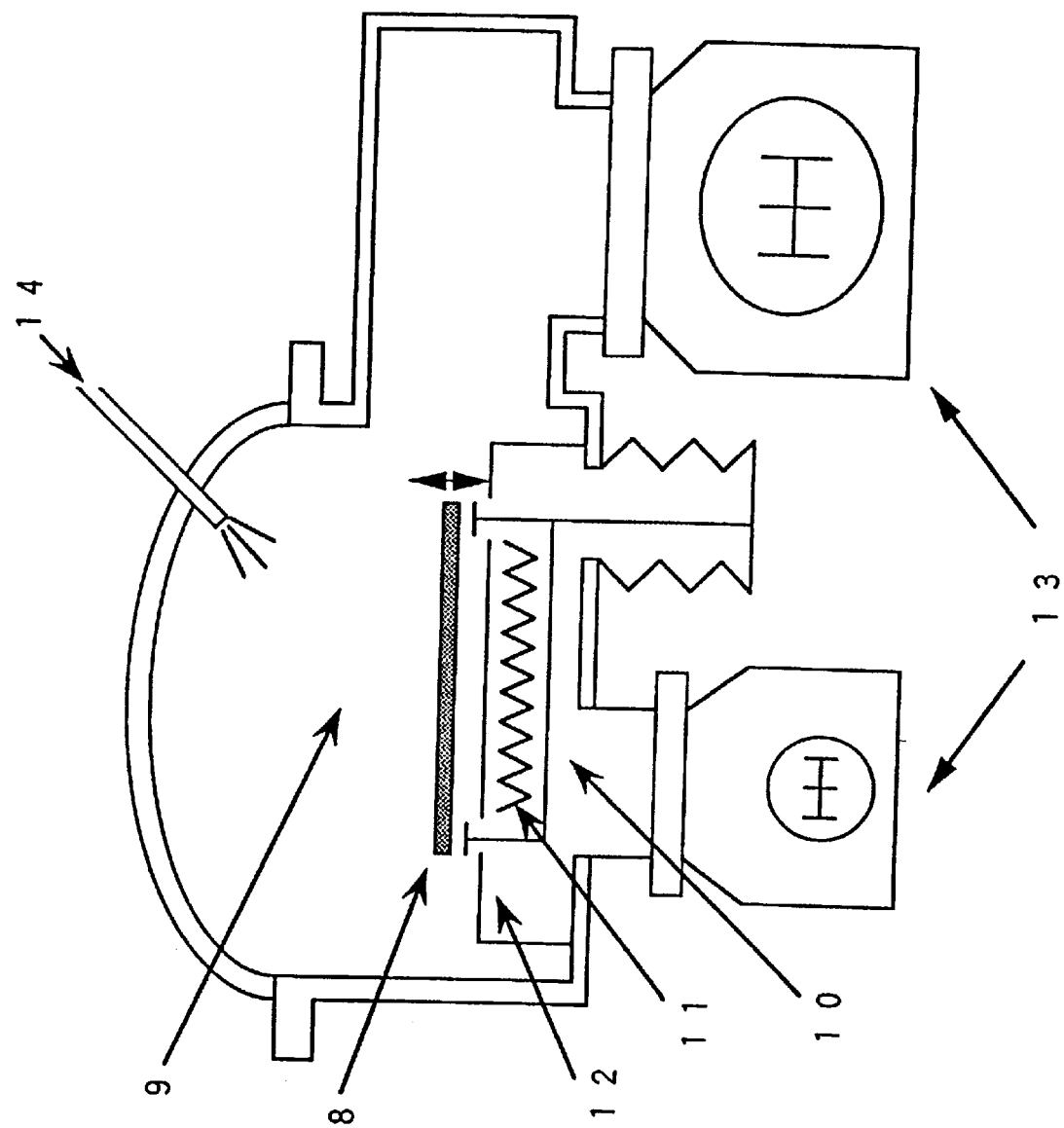
FIG. 6 is a schematic view of a UHV-CVD device used in an $Si_{1-x}Ge_x$ epitaxial growth.

FIG. 1 is a flow sheet of Example 1 of the present invention. In the first place, a p-type Si substrate (resistivity=10 to 20 Ω·cm) having a (100) surface and a diameter of 150 mm was prepared, and a thermal oxide film having a thickness of 100 to 200 Å was formed on this substrate. Next, an oxygen ion was ion-implanted into the substrate under an accelerating energy of 20 keV at a dose of $10^{14}/cm^2$ to form an oxygen-implanted layer in an extremely shallow region (depth=about 200 Å) in the surface of the Si substrate. Next, a DHF treatment was carried out to etch and remove the thermal oxide film, and after water washing, APM washing was done to remove particles and organic substances from the surface of the substrate. After water washing, another DHF treatment was carried out to remove a natural oxide film on the surface of the Si substrate. Afterward, an agent solution was washed out by water washing, and finally, the Si substrate was dried by the use of a spin drier. Next, the Si substrate was loaded into a UHV-CVD device shown in FIG. 6.

Figure 7:
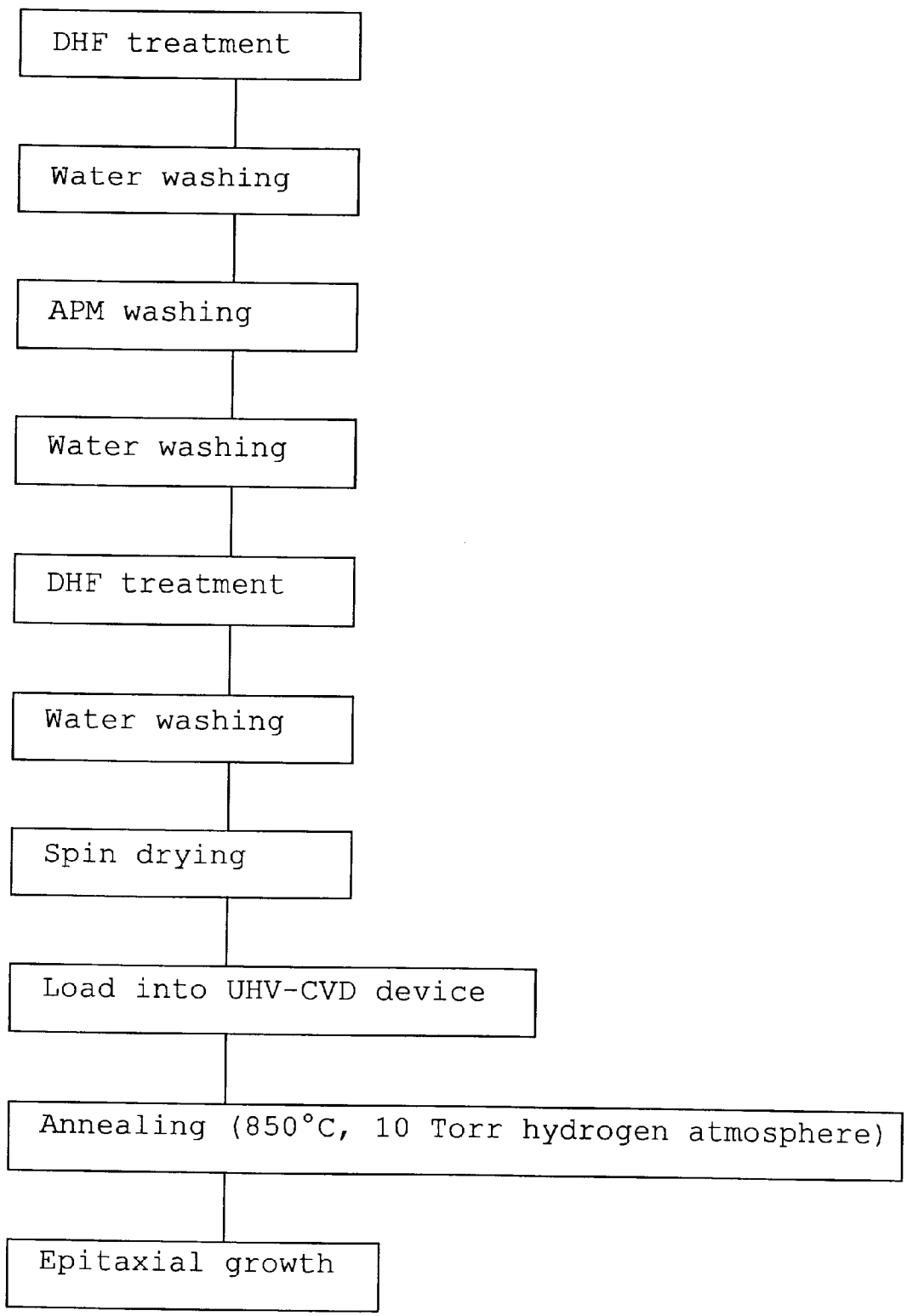
FIG. 7 is a flow sheet of a conventional example.

The Si substrate was set to a suscepter 12, and then heated, for example, up to 750° C. at a temperature of 800° C. or less by the use of a substrate heater 11. At this time, a base pressure was at a level of about $10^{-9}$ Torr. Immediately after the Si substrate was maintained at this temperature for about 10 minutes, the temperature was lowered to 700° C., and an Si epitaxial film having a thickness of 2000 Å was formed by the use of an $Si_2H_6$ gas. Afterward, the Si substrate was taken out, and a contamination amount of carbon (C) and boron (B) in an Si epitaxial film-Si substrate interface was measured by the use of an SIMS. According to the results measured by the SIMS, the C contamination in the interface was not confirmed in this example as in the case of a conventional example in accordance with a flow sheet shown in FIG. 7. This fact of the example would be due to that oxygen diffuses from the oxygen-implanted layer formed on the surface of the Si substrate into the surface of the Si substrate at the ultra high vacuum annealing at 750° C., and this oxygen reacts with C in the surface of the Si substrate to form CO and $CO_2$ and they then volatilize from the surface of the Si substrate. It has been found that if the oxygen-implanted layer is formed in the vicinity of the surface of the substrate, the diffusion of oxygen into the surface of the Si substrate sufficiently occurs even at about 750° C., and in consequence, the C contamination on the DHF-treated Si substrate surface can easily be removed.

Figure 4:
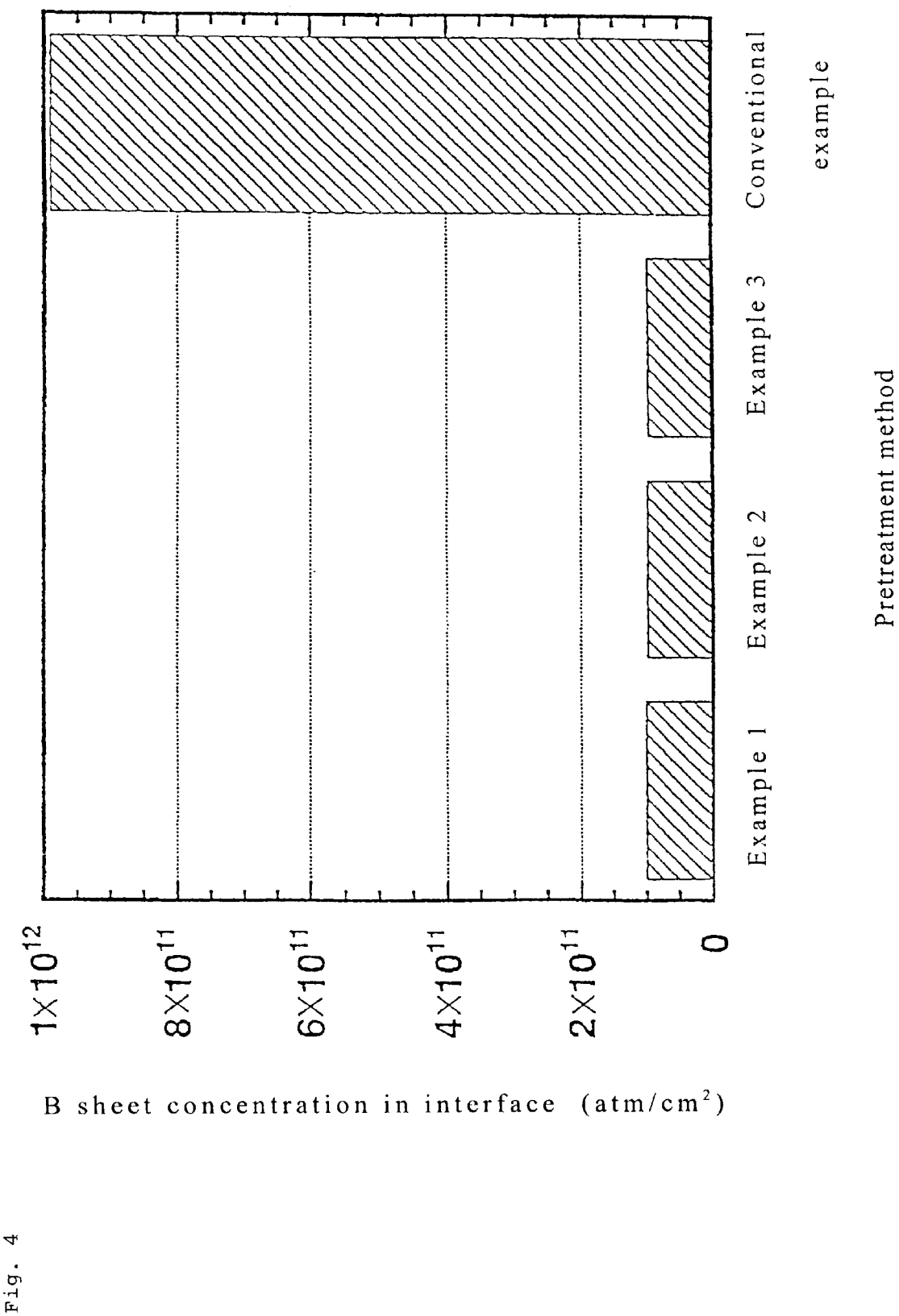
FIG. 4 shows a dependency of a boron sheet concentration in an epitaxial film-Si substrate interface in a pretreatment method (Examples 1 to 3 and a conventional example).

The results of the B (boron) contamination are shown in FIG. 4. That is to say, in this example, the B contamination was about $10^{11}/cm^2$ in terms of a sheet concentration, and this contamination amount was as low as 1/10 of a conventional example in which the B contamination was about $10^{12}/cm^2$. This fact of the example was due to that the annealing before the growth step was done at a low temperature of 750° C., and so the volatilization of B which adhered to the inside wall of the growth chamber was much more restrained as compared with the annealing at 850° C. in the conventional example.

Next, electric properties of devices were inspected to evaluate the effects of the B contamination reduction in the interface.

Figure 5:
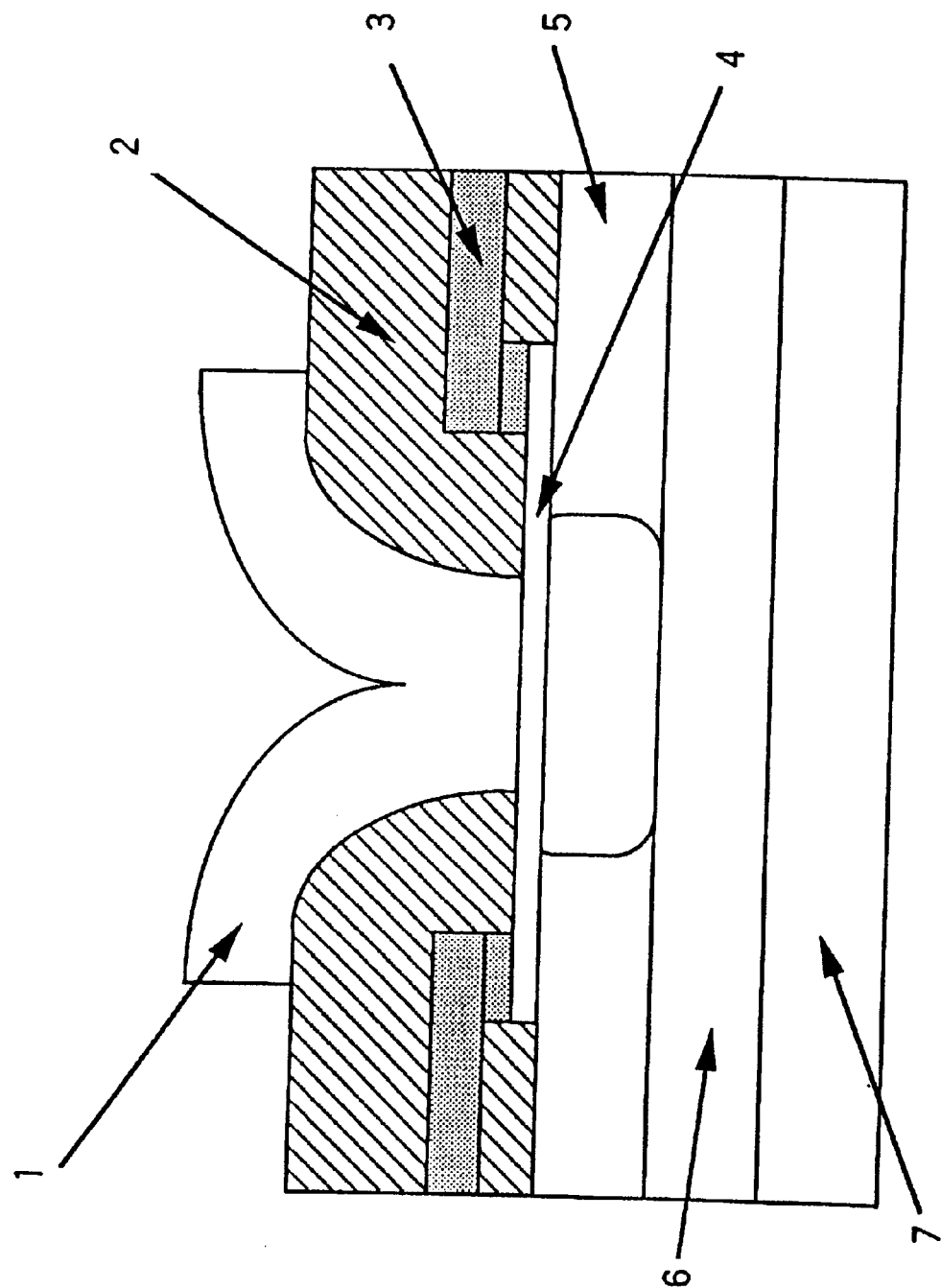
FIG. 5 is a sectional view of a high-speed bipolar transistor of an $Si_{1-x}Ge_x$ epitaxial film base which is used in the evaluation of a cut-off frequency.

FIG. 5 is a sectional view of a high-speed bipolar transistor of an $Si_{1-x}Ge_x$ epitaxial film base which is used in the evaluation of a cut-off frequency. On each p⁻ type (100) Si substrate (resistivity=10 to 20 Ω·cm) 7, an N⁺ layer 6, a collector N⁻ epitaxial layer 5, a silicon oxide film 2 and a p⁺ type polysilicon 3 were formed, and a non-doped $Si_{1-x}Ge_x$ epitaxial film and in-situ B-doped $Si_{1-x}Ge_x$ epitaxial base growth was carried out in accordance with the flow sheets of this example and the conventional example. After the growth, an emitter N⁺ type polysilicon 1 was formed. In accordance with the procedures of this example and the conventional example, high-speed bipolar transistors of the $Si_{1-x}Ge_x$ epitaxial film bases were formed, and a collector current dependency at a cut-off frequency in each high-speed bipolar transistor was then measured. According to the measured results, a maximum cut-off frequency $f_t$ was about 40 GHz in the conventional example, but in this example, it was improved to about 60 GHz. This effect is due to that the B contamination of in the epitaxial film-substrate interface can be remarkably restrained as described above.

EXAMPLE 2

Next, a second example of the present invention will be described.

Figure 2:
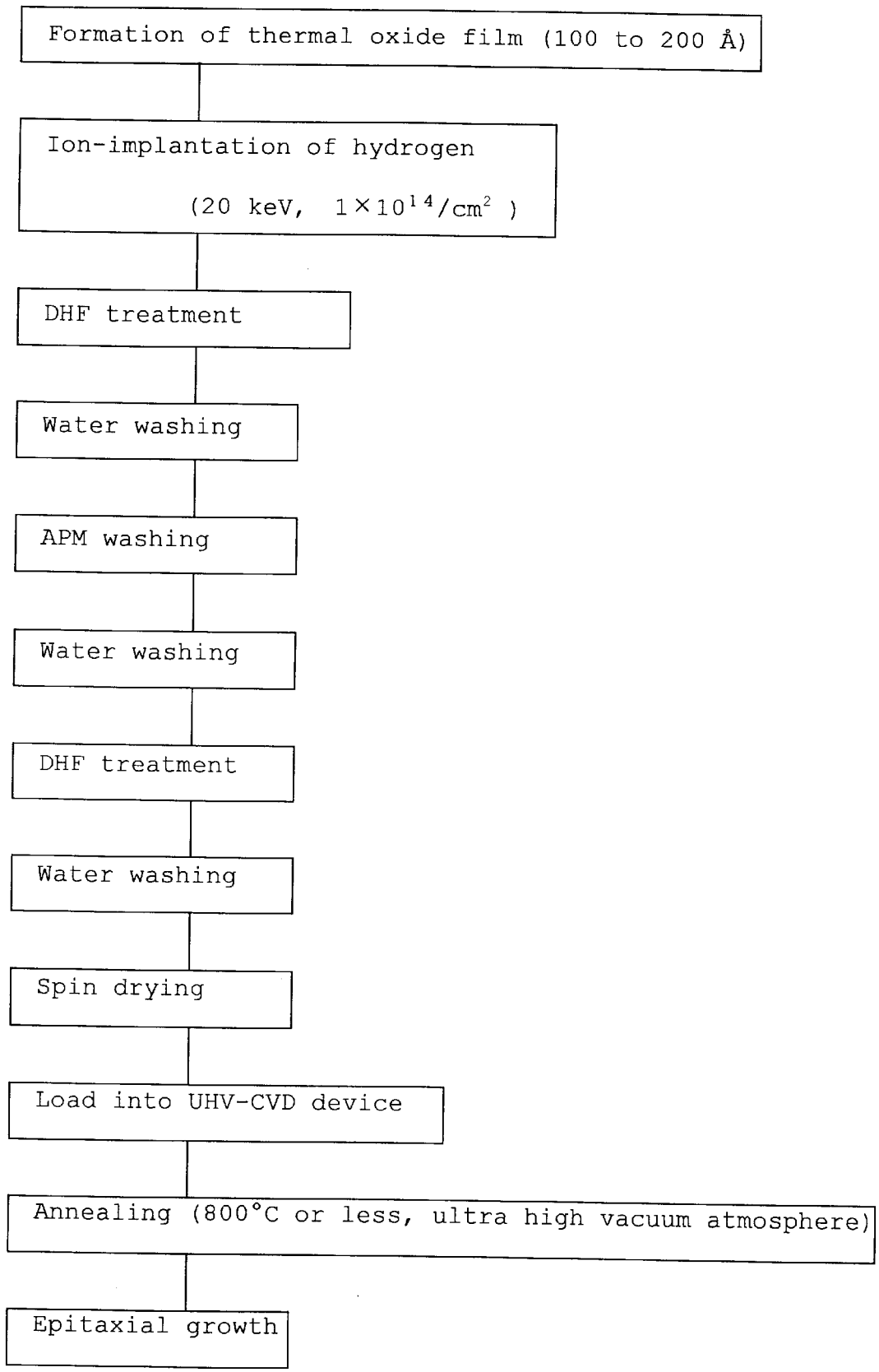
FIG. 2 is a flow sheet of Example 2.

FIG. 2 is a flow sheet of Example 2 of the present invention. An Si substrate used herein was the same as in Example 1. The same procedure as in Example 1 was conducted except that hydrogen was ion-implanted in place of oxygen. According to the results measured by an SIMS, any C contamination in an epitaxial film-Si substrate interface was not confirmed in this example. This fact would be due to that hydrogen diffuses from a hydrogen-implanted layer formed on the surface of the Si substrate into the surface of the Si substrate at an ultra high vacuum annealing at 750° C., and this hydrogen reacts with C in the surface of the Si substrate to form hydrocarbons and the like and they then volatilize from the surface of the Si substrate. It has been found that if the hydrogen-implanted layer is formed in the vicinity of the surface of the substrate, the diffusion of hydrogen to the surface of the Si substrate sufficiently occurs even at about 750° C., and in consequence, the C contamination on the DHF-treated Si substrate surface can easily be removed.

As shown in FIG. 4, a B sheet concentration in the interface in this example was about $10^{11}/cm^2$, and so the B contamination in the interface could be restrained to about 1/10 of a conventional example. This fact is due to that, as in Example 1, the annealing before the growth was carried out at a low temperature of 750° C., and so the volatilization of B which adhered to the inside wall of a growth chamber was much more restrained as compared with the annealing at 850° C. in the conventional example.

Furthermore, also in this example, a bipolar transistor shown in FIG. 5 was experimentally made as in Example 1, and electric properties of the transistor were evaluated. According to the evaluated results, a maximum cut-off frequency $f_t$ in the high-speed bipolar transistor of an $Si_{1-x}Ge_x$ epitaxial film base made by the procedure of this example was about 60 GHz as in Example 1, which meant that the $f_t$ value could be much more improved owing to the restraint of the B contamination in the interface than in the conventional example.

EXAMPLE 3

Next, a third example of the present invention will be described.

Figure 3:
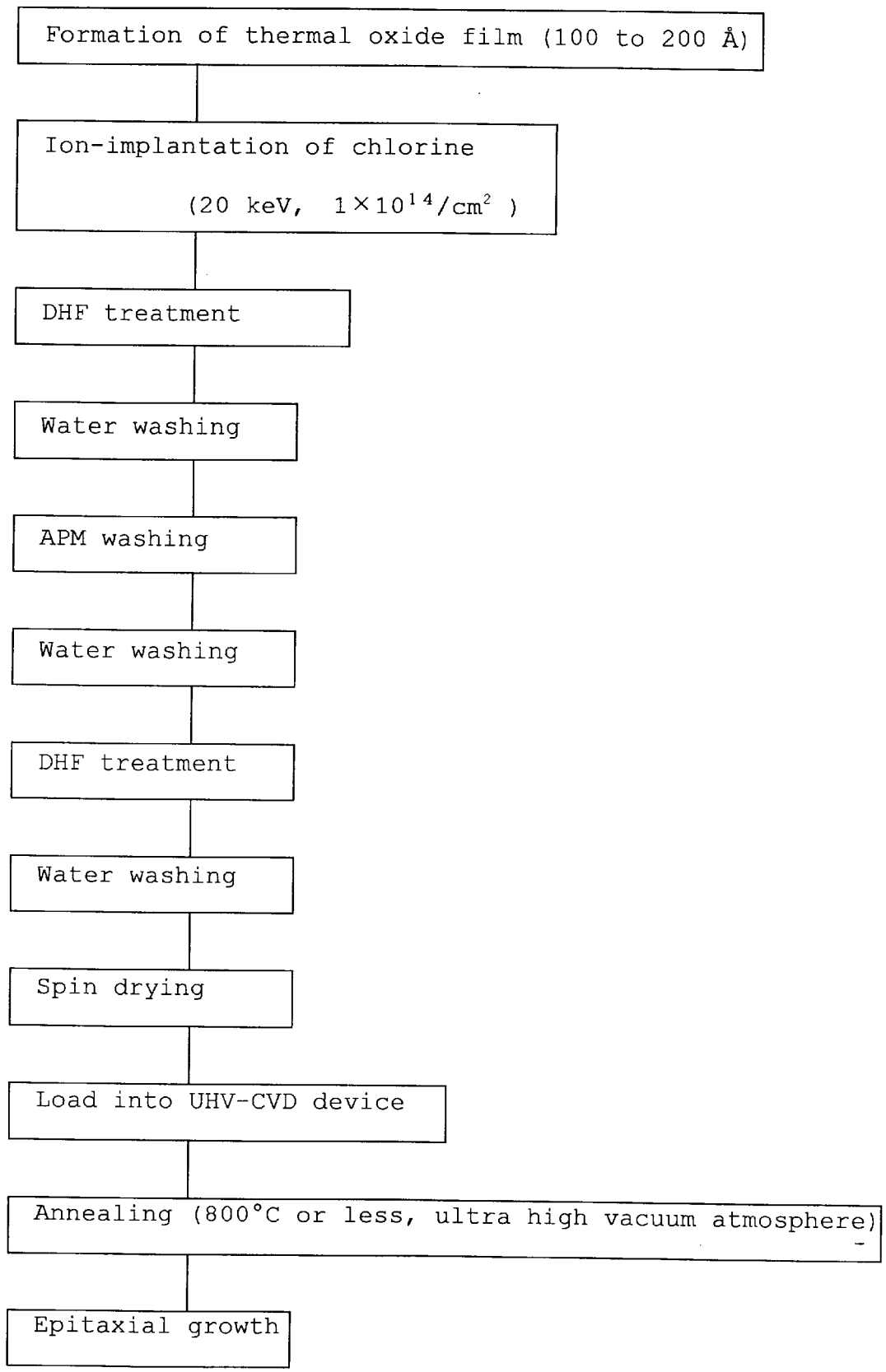
FIG. 3 is a flow sheet of Example 3.

FIG. 3 is a flow sheet of Example 3 of the present invention. An Si substrate used here in was the same as in Example 1 or 2. The same procedure as in Example 1 or 2 was conducted except that chlorine was ion-implanted in place of oxygen or hydrogen. According to the results measured by an SIMS, any C contamination in an epitaxial film-Si substrate interface was not confirmed in this example. This fact would be due to that chlorine diffuses from a chlorine-implanted layer formed on the surface of the Si substrate to the surface of the Si substrate at an ultra high vacuum annealing at 750° C., and this chlorine reacts with C in the surface of the Si substrate to form chlorides of carbon and the like and they then volatilize from the surface of the Si substrate. If the chlorine-implanted layer is formed in the vicinity of the surface of the substrate, the diffusion of chlorine to the surface of the Si substrate sufficiently occurs even at about 750° C., and in consequence, the C contamination on the DHF-treated Si substrate surface can easily be removed.

As shown in FIG. 4, a B sheet concentration in the interface in this example was about $10^{11}/cm^2$, and so the B contamination in the interface could be restrained to about 1/10 of a conventional example. This fact is due to that, as in Example 1 or 2, the annealing before the growth was carried out at a low temperature of 750° C., and so the volatilization of B which adhered to the inside wall of a growth chamber was much more restrained as compared with the annealing at 850° C. in the conventional example.

Furthermore, also in this example, a bipolar transistor shown in FIG. 5 was experimentally made as in Example 1 or 2, and electric properties of the transistor were evaluated. According to the evaluated results, a maximum cut-off frequency $f_t$ in the high-speed bipolar transistor of an $Si_{1-x}Ge_x$ epitaxial film base made by the procedure of this example was about 60 GHz as in Example 1 or 2, which meant that the $f_t$ value could be much more improved owing to the restraint of the B contamination in the interface than in the conventional example.

According to the present invention, an epitaxial film can be formed which is free from contamination with carbon in an interface between an epitaxial film and an Si substrate and an element (e.g., B) which adheres to the inside wall of a growth chamber 9 in a UHV-CVD device. As a result, there can be obtained an effect of remarkably improving electric properties such as a leak current in a diffusion layer of a fine CMOS, the fluctuation of a threshold voltage, a junction leak between a base and a collector in a high-speed bipolar transistor of an $Si_{1-x}Ge_x$ epitaxial film base and cut-off frequency.

What is claimed is:

1. A method for manufacturing a semiconductor device, comprising the steps in sequence of:

(a) ion-implanting an element or a compound which easily reacts with carbon into an Si substrate, (b) washing the Si substrate from step (a) using an aqueous based solution to remove particles and organic substances remaining on the Si substrate after the ion-implanting step, said washing resulting in the formation of a natural oxide film on the Si substrate, (c) removing the natural oxide film on the Si substrate formed in step (b) while leaving the Si substrate intact, (d) annealing the Si substrate from step (c) at a temperature of 800° C. or less in a CVD device, and (e) carrying out Si epitaxial growth or $Si_{1-x}Ge_x$ epitaxial growth on the annealed substrate from step (d) in the CVD device.

2. The method for manufacturing a semiconductor device according to claim 1 wherein the aqueous based solution used in the washing step (b) comprises an ammonia-hydroxide peroxide-water solution.

3. The method for manufacturing a semiconductor device according to claim 1 wherein the element or the compound which easily reacts with carbon used in the ion-implanting step (a) is an element or a compound selected from the group consisting of oxygen, hydrogen, a halogen and a compound thereof.

4. The method for manufacturing a semiconductor device according to claim 2 wherein the element or the compound which easily reacts with carbon used in the ion-implanting step (a) is an element or a compound selected from the group consisting of oxygen, hydrogen, a halogen and a compound thereof.

5. The method for manufacturing a semiconductor device according to claim 3 wherein the halogen is chlorine.

6. The method for manufacturing a semiconductor device according to claim 4 wherein the halogen is chlorine.

7. The method for manufacturing a semiconductor device according to claim 1 wherein the epitaxial growth by the CVD device in step (e) is accomplished by using, as epitaxial growth material, a hydride selected from the group consisting of Si—, Ge—, B— and a mixture thereof.

* * * * *